(12) United States Patent
Nieto et al.

(10) Patent No.: US 7,577,899 B2
(45) Date of Patent: Aug. 18, 2009

(54) CYCLIC REDUNDANCY CHECK (CRC) BASED ERROR CORRECTION METHOD AND DEVICE

(75) Inventors: John Wesley Nieto, Rochester, NY (US); William Nelson Furman, Fairport, NY (US)

(73) Assignee: Harris Corporation, Melbourne, FL (US)

( * ) Notice: Subject to any disclaimer, the term of this patent is extended or adjusted under 35 U.S.C. 154(b) by 625 days.

(21) Appl. No.: 11/352,862

(22) Filed: Feb. 13, 2006

(65) Prior Publication Data

US 2007/0192667 A1    Aug. 16, 2007

(51) Int. Cl.
    *H03M 13/15* (2006.01)
(52) U.S. Cl. .................................... 714/780
(58) Field of Classification Search ............... 714/755, 714/807, 780
    See application file for complete search history.

(56) References Cited

U.S. PATENT DOCUMENTS

| | | | | |
|---|---|---|---|---|
| 4,276,646 | A * | 6/1981 | Haggard et al. | 714/755 |
| 5,491,700 | A * | 2/1996 | Wright et al. | 714/759 |
| 5,606,569 | A * | 2/1997 | MacDonald et al. | 714/758 |
| 5,748,652 | A * | 5/1998 | Kim | 714/807 |
| 6,061,823 | A | 5/2000 | Nara | 714/758 |
| 6,427,219 | B1 | 7/2002 | Yang | 714/758 |
| 6,704,371 | B1 * | 3/2004 | Hishiki et al. | 375/316 |
| 6,802,038 | B1 | 10/2004 | Yu | 714/758 |
| 6,848,069 | B1 | 1/2005 | Levy et al. | 714/755 |
| 7,080,307 | B2 * | 7/2006 | Kondo | 714/758 |
| 7,159,166 | B2 * | 1/2007 | Tsuchinaga | 714/781 |
| 7,228,485 | B1 * | 6/2007 | Wu et al. | 714/758 |
| 7,260,767 | B2 * | 8/2007 | Bhattacharya et al. | 714/782 |
| 7,383,484 | B2 * | 6/2008 | Yeh et al. | 714/758 |
| 7,398,451 | B2 * | 7/2008 | Propp et al. | 714/774 |
| 2001/0010088 | A1 * | 7/2001 | Anzai | 714/782 |
| 2004/0153945 | A1 * | 8/2004 | Takami | 714/758 |

(Continued)

FOREIGN PATENT DOCUMENTS

EP    0798889    10/1997

(Continued)

OTHER PUBLICATIONS

Bo Lin, "Correcting Single-bit Errors with CRC8 in ATM Cell Headers", Freescale Semiconductor, Inc., published Jun. 2005; Document No. AN2918; pp. 1-8.

(Continued)

*Primary Examiner*—Stephen M Baker
(74) *Attorney, Agent, or Firm*—Allen, Dyer, Doppelt, Milbrath & Gilchrist, P.A.

(57) ABSTRACT

The communication method includes the use of CRC codes for additional error correction in addition to the error detection capability. The method is for error detection and correction in a received message that includes N message bits and M Cyclic Redundancy Check (CRC) bits appended thereto. It is determined whether at least one bit error has occurred in the N message bits and M CRC bits of the received message based upon the M CRC bits, and when at least one bit error is determined, then K bits with a lowest quality metric are selected from the N message bits and M CRC bits. The bit error is corrected based upon possible bit error patterns and the selected K bits. Multiple bit errors may also be corrected.

23 Claims, 5 Drawing Sheets

U.S. PATENT DOCUMENTS

2006/0123311 A1*  6/2006  Degn .......................... 714/758
2008/0288845 A1* 11/2008  Tsfati et al. ................. 714/748

FOREIGN PATENT DOCUMENTS

EP          1176726        1/2002

OTHER PUBLICATIONS

David Chase; "*A Class of Algorithms for Decoding Block Codes with Channel Measurement Information*"; vol. 18, No. 1, Jan. 1972; pp. 170-182; XP000500203.

Di-Ping Chou et al.; "*Soft-Decision Decoding of CRC Codes*"; Jun. 24, 1991, pp. 91-91; XP010046845.

Zhao H. et al.; "*A Hybrid ARQ Scheme for DS-CDMA Mobile Data*"; vol. 1, Oct. 2, 1996, pp. 71-75; XP0020923451.

Shi-yi Chen et al.; "*Error Correcting Cyclic Redundancy Checks Based on Confidence Declaration*"; Jun. 21, 2006; pp. 511-514; XP009082289.

* cited by examiner

FIG. 4

| | CRC CHECK BITS | | | | | | | | MESSAGE BITS | | | | | | | |
|---|---|---|---|---|---|---|---|---|---|---|---|---|---|---|---|---|
| TRANSMIT BITS | 0 | 1 | 0 | 1 | 1 | 1 | 0 | 0 | 0 | 1 | 1 | 1 | 0 | 0 | 1 | 0 |
| QUALITY METRICS | 0.63 | 0.95 | 0.78 | 1.24 | 0.82 | 0.52 | 1.17 | 0.80 | 1.27 | 0.91 | 0.91 | 1.18 | 0.89 | 0.62 | 1.13 | 1.13 |
| RECEIVE BITS | 0 | 1 | 0 | 1 | 1 | 1 | 0 | 0 | 0 | 1 | 1 | 1 | 0 | 0 | 1 | 0 |

FIG. 5

| | CRC CHECK BITS | | | | | | | | MESSAGE BITS | | | | | | | |
|---|---|---|---|---|---|---|---|---|---|---|---|---|---|---|---|---|
| TRANSMIT BITS | 0 | 1 | 0 | 1 | 1 | 1 | 0 | 0 | 0 | 1 | 1 | 1 | 0 | 0 | 1 | 0 |
| QUALITY METRICS | 0.18 | 0.89 | 0.50 | 1.55 | 0.59 | 0.06 | 1.38 | 0.55 | 1.60 | 0.80 | 0.81 | 1.40 | 0.75 | 0.14 | 0.31 | 1.29 |
| RECEIVE BITS | 0 | 1 | 0 | 1 | 0 | 0 | 0 | 0 | 0 | 1 | 1 | 1 | 0 | 0 | 1 | 0 |

FIG. 6

| | CRC CHECK BITS | | | | | | | | MESSAGE BITS | | | | | | | |
|---|---|---|---|---|---|---|---|---|---|---|---|---|---|---|---|---|
| TRANSMIT BITS | 0 | 1 | 0 | 1 | 1 | 1 | 0 | 0 | 0 | 1 | 1 | 1 | 0 | 0 | 1 | 0 |
| QUALITY METRICS | 0.16 | 0.86 | 0.30 | 1.77 | 0.42 | 0.50 | 1.54 | 0.37 | 1.80 | 0.72 | 0.73 | 1.57 | 0.64 | 0.21 | 1.43 | 1.41 |
| RECEIVE BITS | 1 | 1 | 0 | 1 | 0 | 0 | 0 | 0 | 0 | 1 | 1 | 1 | 0 | 1 | 1 | 0 |

CYCLIC REDUNDANCY CHECK (CRC) BASED ERROR CORRECTION METHOD AND DEVICE

FIELD OF THE INVENTION

The present invention relates to the field of communications, and, more particularly, to the correction of errors in received signals and related methods.

BACKGROUND OF THE INVENTION

Several methods are known for improving the reliability of data transmitted through a communications network. Parity checking includes the use of parity bits which are appended to bytes, blocks or frames of digital transmissions and allow the determination of some types of transmission errors. Another technique is to send identical data streams along two or more separate paths and then to select the best of the received signals or to combine the received signals in some way to obtain a higher quality result. For instance, it is known from U.S. Pat. No. 4,953,197 to use two receiving antennae in parallel and quality data and parity information are checked for each data word of the two signals received from the antennae and the best signal selected. U.S. Pat. Nos. 5,268,909, 5,406,563, 5,436,915, and 5,422,647 all provide methods of error checking of two or more transmissions of the same information down different paths of the system.

Yet another technique is known as ARQ or automatic repeat requests in which a byte, frame or block of data is retransmitted automatically when an error is detected therein in the receiver. Examples of such systems are "stop and wait" or "continuous" ARQ. Further, general types of ARQ are known in which not all of the byte, block or frame is re-transmitted but only some additional information which allows the erroneous signal to be corrected, e.g. using forward error correction techniques. This is sometimes known as ARQ with incremental forward error correction.

Forward error correction (FEC) is known in which errors in the transmitted digital signal are corrected without re-transmitting the same signal. This requires a more complex type of error coding in which sufficient additional correction bits are provided so that the original message can be reconstructed from a signal transmitted with errors. Examples are the Hagelberger, Bose-Chaudhuri, Hamming, convolutional and block codes. The number of additional bits necessary to provide reliable correction can be high which reduces the throughput of the system drastically. However, where a high level of quality is required and retransmissions cannot be tolerated, these methods are most useful. To reduce the reduction in capacity caused by the additional correction bits the number of bits may be reduced by "puncturing" in which a certain proportion of bits from the forward error coded signal are removed. This reduces the quality and reliability of the error correction but increases the data rate.

Combinations of the above are also used. For example, U.S. Pat. No. 5,657,325 describes a combined ARQ and FEC technique in which a signal is error coded, punctured and then transmitted over a first radio channel from one antenna to a receiver and on receiving a negative acknowledgment from the receiver (the signal cannot be corrected properly at the receiver), the relevant punctured bits are sent via a second antenna, i.e. via a separate channel which may have better transmission quality or may introduce different or less troublesome errors. The disadvantage of this technique is that even retransmission of only the punctured bits introduces temporal latency into the transmission which is often unacceptable, e.g. in voice transmissions in which only minimal delay can be tolerated. Further, it is not possible to reconstruct the complete message from the punctured bits alone and the first message must always be used in the reconstruction attempt. It is therefore possible that if the originally received message contains many errors it is not possible to reconstruct an accurate copy of the transmitted message.

Cellular Telecommunications Systems Often include some form of compression of voice messages, e.g. a Vector Sum Excited Linear Prediction (VSELP) speech coder, convolutional coding for error protection, some form of modulation, e.g. differential quadrature phase shift keying (QPSK) modulation, and some form of access scheme, e.g. a time division, multiple access (TDMA) scheme or a Code Division Multiple Access (CDMA) scheme employing a frame subdivided into a number of time slots per carrier frequency. Also, Viterbi coders and decoders as well as convolutional coding are described in "Mobile Radio Communications", by Raymond Steele, Pentech Press, 1992.

The current state of the art is to use cyclic redundancy check (CRC) codes to detect errors in a block of transmitted bits. In general an N bit CRC code will have a probability of failure of $(\frac{1}{2})^N$ which only occurs in a very high noise environment. Values of 16 and 32 are common for N. Failure is defined as the code check passing when in fact there are errors in the message. A second failure mode exists when there are no errors in the message but the CRC check fails, signifying that one or more of the CRC bits were in error. This mechanism occurs much less frequently and the associated cost of throwing out a bad message is small.

Modern data networking communication systems are relying more and more on burst transmissions to perform network command and control functions as well as the transmission of burst data. Since, it is standard practice in the industry to utilize the CRC code for error detection, each packet or burst of data includes a CRC code with its data. This allows the receiver to determine with fairly high accuracy if the received bits are correct. The disadvantage of this technique, similar to other coding techniques, is that it adds overhead to the transmission by requiring the transmission of extra bits. The CRC bits to send can be calculated in a number of different ways but most rely on a feedback register architecture where the entire message to be encoded is passed into the register and the final CRC bits used is the state of the register at the conclusion of the process. Standard sizes for CRC codes used in industry are 32, 16 and 8 bits. For short burst transmissions these may end up being a significant portion of a transmission.

SUMMARY OF THE INVENTION

In view of the foregoing background, it is therefore an object of the present invention to provide a communication method and device including the use of CRC codes for additional error correction in addition to the error detection capability.

This and other objects, features, and advantages in accordance with the present invention are provided by a method for error detection and correction in a received message comprising N message bits and M Cyclic Redundancy Check (CRC) bits appended thereto. The method may include determining whether at least one bit error has occurred in the N message bits and M CRC bits of the received message based upon the M CRC bits, and when at least one bit error is determined, then selecting, from the N message bits and M CRC bits, K bits with a lowest quality metric. Then at least one bit error may be corrected based upon possible bit error patterns of the selected K bits.

A quality metric may be assigned to each of the N message bits and M CRC bits, and the assigned quality metrics may be compared to a threshold and/or sorted to select the K bits. Such a threshold may be based upon the number N of message bits and the number M of CRC bits. The assigned quality metric may be based upon at least one of a Received Signal to Noise Ratio RSNR) and a Forward Error Correction (FEC) confidence value, for example.

Also, the message may be a message received over a wireless communications channel, and selecting may include selecting based upon a wireless communications channel threshold value. The possible bit error patterns are preferably stored in a memory and/or table, and are preferably single-bit error patterns. Here, determining may comprise determining whether a multiple-bit error has occurred in the N message bits and M CRC bits of the received message based upon the M CRC bits and further based upon a failure to match with the single-bit error patterns. Also, correcting may comprise correcting the multiple-bit error based upon a logical combination, such as an exclusive OR operation, of a plurality of single-bit error patterns.

Objects, features, and advantages in accordance with the present invention are also provided by a communications device including an input for receiving a message comprising N message bits and M Cyclic Redundancy Check (CRC) bits appended thereto. The communications device may be a mobile wireless communications device, for example. An error detection and correction block may be connected to the input for determining whether at least one bit error has occurred in the N message bits and M CRC bits of the received message based upon the M CRC bits, and when at least one bit error is determined, then selecting, from the N message bits and M CRC bits, K bits with a lowest quality metric, and correcting the at least one bit error based upon possible bit error patterns and the selected K bits. An output may be connected to the error detection and correction block for outputting the corrected message.

The error detection and correction block may include a quality metric unit to assign a quality metric to each of the N message bits and M CRC bits, and may further include a comparator to compare the assigned quality metrics to a threshold to select the K bits. The assigned quality metric may be based upon at least one of a Received Signal to Noise Ratio (RSNR) and a Forward Error Correction (FEC) confidence value.

The error detection and correction block may include a memory and/or table to store the possible bit error patterns which are preferably single-bit error patterns. The error detection and correction block may determine whether a multiple-bit error has occurred in the N message bits and M CRC bits of the received message based upon the M CRC bits and further based upon a failure to match with the single-bit error patterns. The error detection and correction block corrects the multiple-bit error based upon a logical combination of a plurality of single-bit error patterns.

The method and device may be considered as using a Forward Error Correction (FEC) technique that utilizes a well known method for the detection of bit errors and enhances to correct a number of errors without significantly compromising the error detection capability.

BRIEF DESCRIPTION OF THE DRAWINGS

FIGS. 4-6 are diagrams illustrating various examples of transmit and receive bits and the associated quality metrics.

DETAILED DESCRIPTION OF THE PREFERRED EMBODIMENTS

Figure 1:
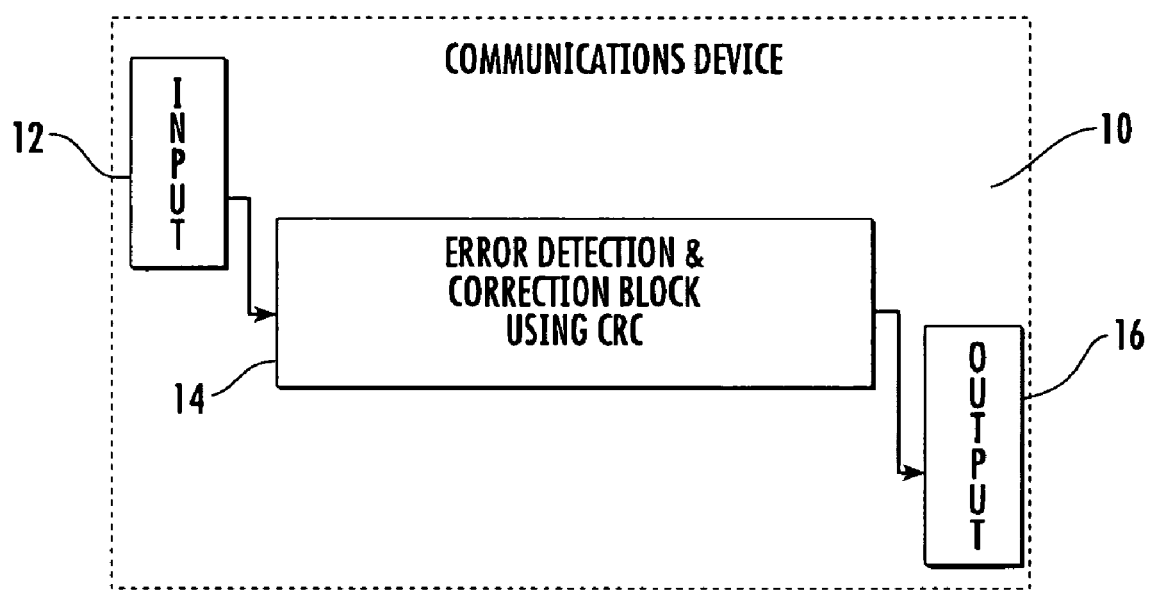
FIG. 1 is a block diagram of a communications device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As will be appreciated by those skilled in the art, portions of the present invention may be embodied as a method, data processing system, or computer program product. Accordingly, these portions of the present invention may take the form of an entirely hardware embodiment, an entirely software embodiment, or an embodiment combining software and hardware aspects. Furthermore, portions of the present invention may be a computer program product on a computer-usable storage medium having computer readable program code on the medium. Any suitable computer readable medium may be utilized including, but not limited to, static and dynamic storage devices, hard disks, optical storage devices, and magnetic storage devices.

The present invention is described below with reference to flowchart illustrations of methods, systems, and computer program products according to an embodiment of the invention. It will be understood that blocks of the illustrations, and combinations of blocks in the illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, implement the functions specified in the block or blocks.

These computer program instructions may also be stored in a computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

As discussed, communication systems may use burst transmissions to perform network command and control functions as well as the transmission of burst data. Each packet or burst of data includes a CRC code with its data. This allows the receiver to determine with fairly high accuracy if the received bits are correct. The CRC bits to send can be calculated in a number of different ways but most rely on a feedback register architecture where the entire message to be encoded is passed into the register and the final CRC bits used is the state of the register at the conclusion of the process. Standard sizes for CRCs used in industry are 32, 16 and 8 bits. For short burst transmissions these CRCs may end up being a significant portion of a transmission.

A register is a semiconductor device that is used for storing several bits of digital data. It basically includes a set of flip-flops, with each flip-flop representing one bit of the register. Thus, an n-bit register has n flip-flops. A basic register is also known as a "latch."

A special type of register, known as the shift register, is used to pass or transfer bits of data from one flip-flop to another. This process of transferring data bits from one flip-flop to the next is known as "shifting." Shift registers are useful for transferring data in a serial manner while allowing parallel access to the data. A shift register is simply a set of flip-flops interconnected in such a way that the input to a flip-flop is the output of the one before it. Clocking all the flip-flops at the same time will cause the bits of data to shift or move toward the last flip-flop. A shift-register can also be implemented in software or a computer or Field Programmable Gate Array (FPGA) as would be appreciated by those skilled in the art.

CRC codes may be generated by an M state feedback shift register. The flip-flops of the feedback shift register are placed in a known state and the N message bits are shifted into the structure. The input bits are added (exclusive-or'd) with the several of the bits of the shift register, for example. The result is shifted into the shift register. The M bit state of the feedback shift register, after all message bits have been shifted into it is known as the CRC code or CRC bits and can be transmitted along with the message bits to provide error detection capability. Those skilled in the art will appreciate that other techniques for generating the CRC code may also be used.

At the receive site, all of the transmitted bits, including the message bits and appended CRC bits, are processed by an equivalent shift register based device. The resulting state of the receive shift register will be all zeros if there are no errors in the transmission. Another method to determine CRC errors is to simply shift the N message bits through shift register and then Xor with the received M CRC bits. Of course, other techniques may also be available as would be appreciated by the skilled artisan.

Referring now to FIG. 1, a communication device according to the present invention will now be described. The communications device 10 may be any device that receives and processes data within a data communication network, and may also be a wireless or portable electronic device such as a mobile phone, personal digital assistant (PDA), wireless email device, pager, or the like.

The communications device 10 includes an input 12 for receiving a message comprising N message bits and M Cyclic Redundancy Check (CRC) bits appended thereto. The communications device 10 may be a wireless communications device wherein the input 12 is an antenna. An error detection and correction block 14 is connected to the input 12 for determining whether at least one bit error has occurred in the N message bits and M CRC bits of the received message based upon at least the M CRC bits. When one or more bit errors are determined, the error detection and correction block 14 then selects, from the N message bits and M CRC bits, K bits with a lowest quality metric, and corrects the bit error(s) based upon possible bit error patterns and the selected K bits. An output 16 is connected to the error detection and correction block 14 for outputting the corrected message.

Figure 2:
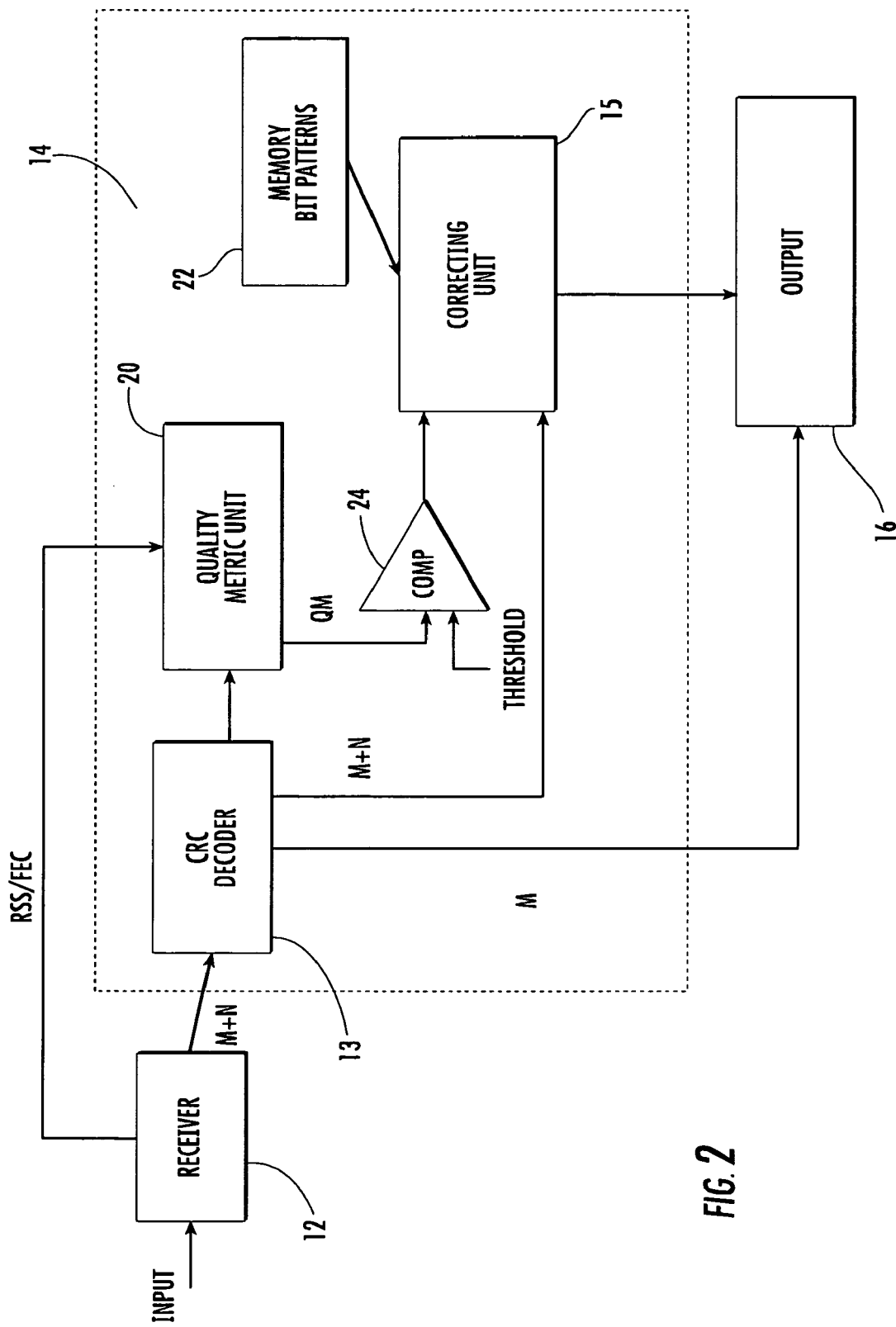
FIG. 2 is a schematic diagram illustrating the details of the error detection and correction block of FIG. 1.

Referring now to FIG. 2, the error detection and correction block 14 may include a CRC decoder 13 for performing the CRC and forwarding the M message bits to the output 16 if the CRC passes. If an error is detected, a quality metric unit 20 assigns a quality metric to each of the N message bits and M CRC bits, and the error detection and correction block 14 may further include a comparator 24 to compare the assigned quality metrics to a threshold to select the K bits. The assigned quality metric may be based upon at least one of a Received Signal to Noise Ratio (RSNR) and a Forward Error Correction (FEC) confidence value, for example, provided by the input/receiver 12. The threshold or RSNR can be used to change the number of bits for correction.

The error detection and correction block 14 may include a memory 22 and/or table to store the possible bit error patterns which are preferably single-bit error patterns. The error detection and correction block 14 may determine whether a multiple-bit error has occurred in the N message bits and M CRC bits of the received message based upon at least the M CRC bits and further based upon a failure to match the CRC value with the single-bit error patterns. The error detection and correction block 14, via correaction unit 15, corrects the single-bit errors based upon the single bit-error patterns, and corrects the multiple-bit errors based upon a logical combination of a plurality of single-bit error patterns. Single bit errors may be corrected without reference to the K bits and quality metrics.

One aspect of this invention is the pre-calculation of CRC bits for different single bit error patterns. The total number of bits transmitted is N+M, N message bits plus M CRC Check bits. An N+M element look up table, e.g. in the memory 22, is used. The index of the table is the position of the single error in the transmitted bit stream. The table element contains the M bit CRC check that would result at the receiver if a bit error was made at that position.

An implementation of the invention would check the resulting receive CRC against all elements of the table to determine if the received bit stream is suffering from a single bit error in any of the positions. A more elaborate approach, described herein, utilizes received bit quality metrics combined with the table to determine the most likely error patterns. Quality metrics for different bits that need to be corrected can be added together to determine the cost of correaction, and with a comparison to a threshold, it can be determined whether the cost is too high. If so, the error pattern would not be corrected with the approach described herein.

For the purpose of an example, an eight bit message (N=8) is transmitted with the aid of an eight bit CRC code (M=8) for a total transmission of sixteen bits. The CRC generator polynomial is 0x3 as depicted in the table 1 below, where 0x signifies the number is in hexadecimal notation. The 16 element Look-Up-Table is pre-calculated by calculating the receive CRC bits for all patterns of a single 1 (one) and fifteen 0s (zeros) representing all the possible single bit errors.

TABLE 1

| Index | CRC |
| --- | --- |
| 0 | 0x03 |
| 1 | 0x06 |
| 2 | 0x0C |
| 3 | 0x18 |
| 4 | 0x30 |
| 5 | 0x60 |
| 6 | 0xC0 |
| 7 | 0x83 |
| 8 | 0x05 |
| 9 | 0x0A |
| 10 | 0x14 |
| 11 | 0x28 |
| 12 | 0x50 |
| 13 | 0xA0 |
| 14 | 0x43 |
| 15 | 0x86 |

Referring to FIG. 4, an example of an error free reception will now be discussed. In this case when the receive bits are processed by the error detection and correaction block 14, e.g. in a receive shift register device, the result is the all zero state signifying that the message was received correctly. Note all the quality metrics, which will be discussed in further detail below, are relatively high. No further action is required because the message has been received error free.

Referring now to FIG. 5, an example of a single bit error reception will now be discussed. In this case when the receive bits are processed by the receive shift register device the result is 0x60. This CRC value is contained in element 5 of the single bit error look up table (Table 1 above) so it is determined that bit 5 has been received in error. This can be easily verified by comparing the transmitted bits in the first row of FIG. 5 with the receive bits of row 3. It should be noted that the receive quality metric of this bit is the lowest of all sixteen received bits.

An additional feature may include the use of a Received Signal to Noise ratio (RSNR) based threshold to this metric and the correaction only being made if the metric was above or below a specified threshold. This would help to prevent the occurrence of making false corrections.

Referring to FIG. 6, an example of a multiple bit error reception is now discussed. In this case when the receive bits are processed by the receive shift register device the result is 0xC3. Since the CRC value is not 0 we know that there are errors present. Since the value 0xC3 is not contained in the look up table (Table 1) it is determined there are multiple bit errors, as a single error CRC would be contained in the table.

It should be pointed out that the CRC value 0xC3 can be achieved by exclusive or-ing the table values associated with bit positions 0, 5 and 13 together. That is 0x03+0x60+ 0xA0=0xC3. It is important to know which single bit CRC bits, or equivalently which single bit errors need to be combined together to create the received error pattern.

The error detection and correaction block 14 of the invention may look at some or all of the received bit quality metrics, for example. These metrics can be generated in a number of different ways: either received signal values (such as bit soft decisions derived from received symbols values) or a confidence value returned by a Forward Error Correaction (FEC) scheme utilized by the transmission signal. The invention determines the (K) most likely error bits by finding the K bits with the smallest quality metrics. In this example k=6. The 6 lowest quality bits are bits 0, 2, 4, 5, 7 and 13 with the corresponding metrics of 0.16, 0.30, 0.42, 0.50, 0.37, and 0.21. For ease of explanation, these bit locations are referred to as A, B, C, D, E and F.

The invention may systematically look at all two and three bit error patterns. Given that there are six possible error bits being considered there are fifteen possible two bit errors (6*5/2) and twenty possible three bit errors (6*5*4/3/2/1). For each two and three bit error considered a metric is calculated as the sum of the individual bit quality metrics. All possibilities for this example are tabulated in the following Table.

TABLE 2

| 2 Bit Error Pattern | Metric | 3 Bit Error Pattern | Metric |
| --- | --- | --- | --- |
| AB | .46 * | ABC | .88 * |
| AC | .58 * | ABD | .96 |
| AD | .66 | ABE | .83 * |
| AE | .53 * | ABF | .67 * |
| AF | .37 * | ACD | 1.08 |
| BC | .72 | ACE | .95 |
| BD | .80 | ACF | .79 * |
| BE | .67 | ADE | 1.03 |
| BF | .51 * | ADF | .87 * |
| CD | .92 | AEF | .74 * |
| CE | .79 | BCD | 1.22 |
| CF | .63 | BCE | 1.09 |
| DE | .87 | BCF | .93 |
| DF | .71 | BDE | 1.17 |
| EF | .58 * | BDF | 1.01 |
|  |  | BEF | .89 |
|  |  | CDE | 1.29 |
|  |  | CDF | 1.13 |
|  |  | CEF | 1.00 |
|  |  | DEF | 1.08 |

The next step is to rank the 2 bit and 3 bit error quality metrics, noting that the smaller metrics relate to the most likely error events. An (*) has been put by the six lowest metrics of the 2 bit error patterns and also by the six lowest metrics of the 3 bit error patterns. The selection of which bit patterns to consider could also be based on a SNR based threshold value, instead of a fixed number of small values. For each bit error pattern selected the resulting CRC is calculated by exclusive or'ing the single bit patterns in the table.

For example, the first two bit pattern in the table corresponds to AB which is bits 0 and 2. Exclusive or'ing the two table values together, 0x03+0x0C=0x0F. This does not match the received CRC value of 0xC3 so a correaction is not made. Next, the three bit error pattern ADF is considered. ADF corresponds to bit positions 0, 5 and 13. Exclusive or'ing these three table values together yields, 0x03+0x60+ 0xA0=0xC3. Since this matches the received CRC value and the pattern metric is one of the six smallest (or alternatively below an SNR driven threshold), this correaction is accepted and used to correct bits 0, 5 and 13 in the received message.

Figure 7:
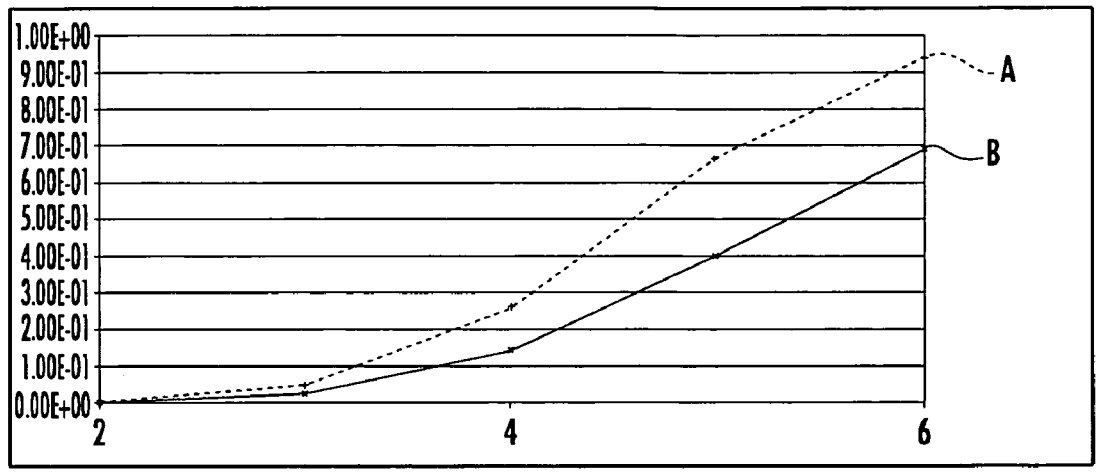
FIGS. 7 and 8 are graphs respectively illustrating the improvement in burst error rate and the probability of undetected error for the device and method of the present invention.
Figure 8:
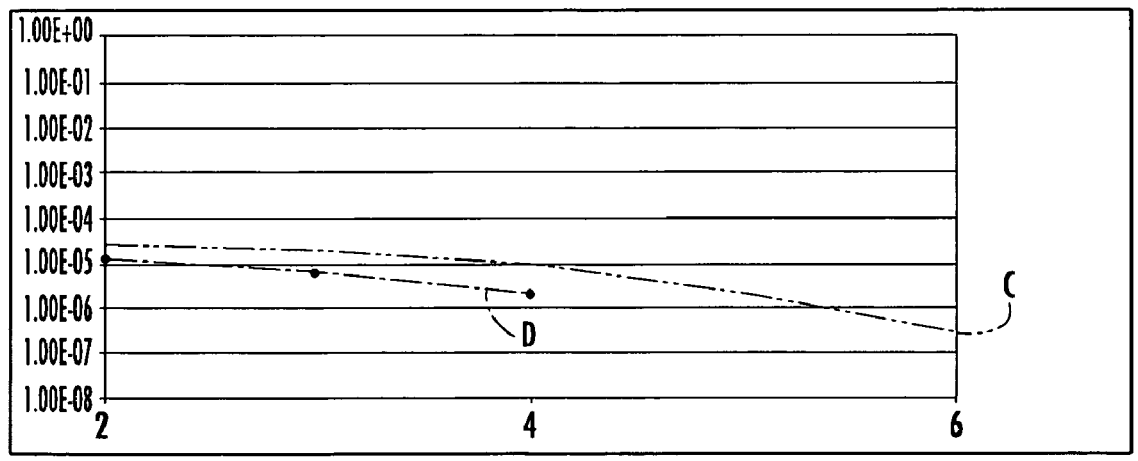

The invention attempts to use some of the error detection capability of the CRC code for error correaction without paying too much of a penalty in increased undetected errors. The graph of FIG. 7 shows the improvement A in probability of correct burst achieved by the invention versus an approach that does not include the invention B. The graph of FIG. 8 shows the associated increase (C v. D) in undetected error rate with the invention. Note the relatively slight increase in undetected error rate for the associated improvement discussed above.

Figure 3:
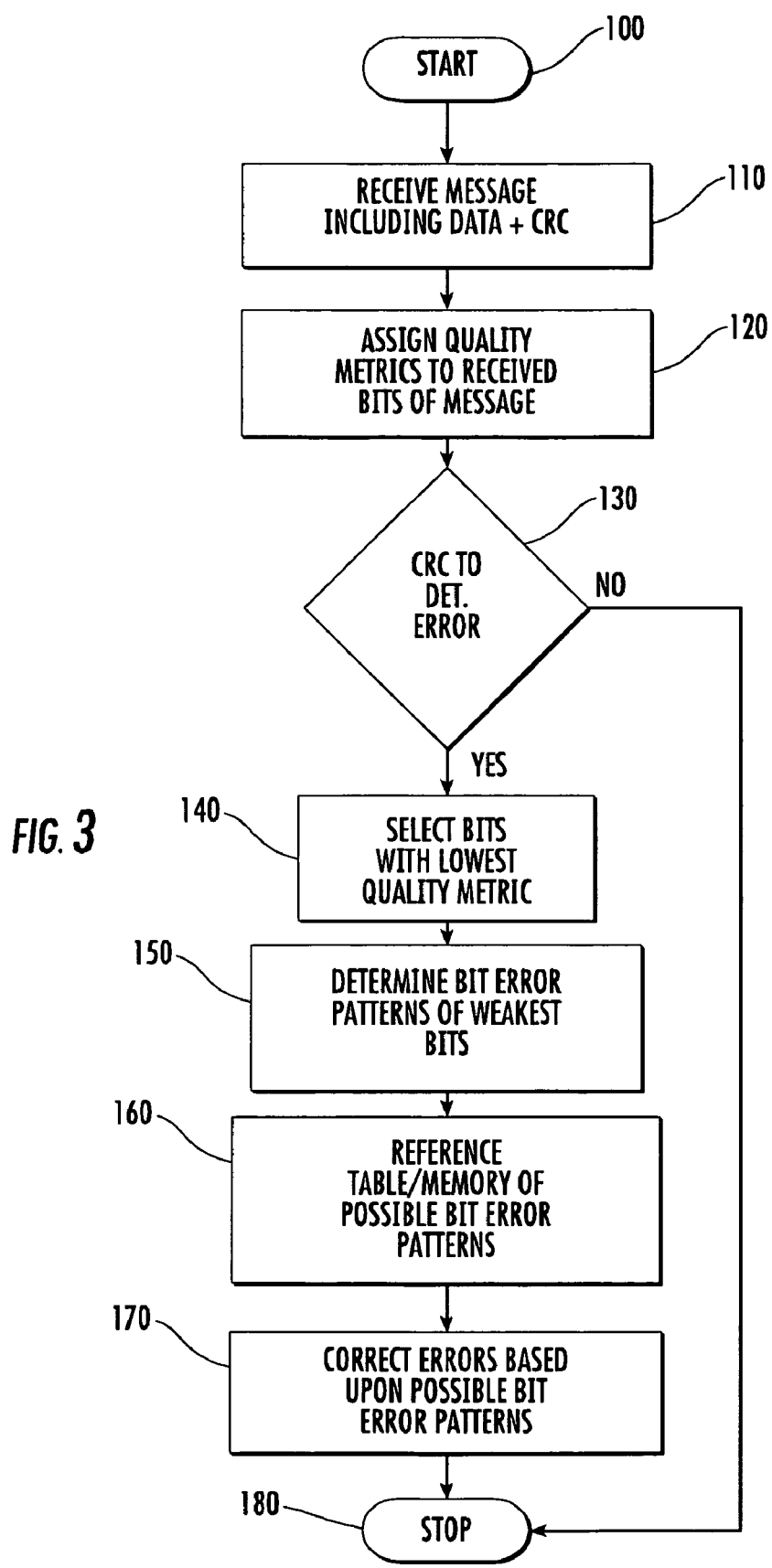
FIG. 3 is a flowchart illustrating steps of the method in accordance with the present invention.

A communication method including the use of CRC codes for additional error correaction in addition to the error detection capability will now be described with reference to the flowchart of FIG. 3. The method is for error detection and correaction in a received message that includes N message bits and M Cyclic Redundancy Check (CRC) bits appended thereto, as previously discussed. The method begins (block 100) and includes receiving the message (block 110) and determining whether at least one bit error has occurred in the N message bits and M CRC bits of the received message based upon the M CRC bits (block 130). As discussed above, when the message is received error free, then the data is passed to the processor or user. However, when at least one bit error is determined at block 130, then K bits with a lowest quality metric are selected (block 140) from the N message bits and M CRC bits. The bit error(s) is corrected (block 170) based upon possible bit error patterns and the selected K bits before the method ends at block 180.

At block 120, a quality metric may be assigned to each of the N message bits and M CRC bits, and the assigned quality metrics may be compared to a threshold to select the K bits. Such a threshold may be based upon the number N of message bits and the number M of CRC bits. The assigned quality metric may be based upon at least one of a Received Signal to Noise Ratio (RSNR) and a Forward Error Correaction (FEC) confidence value. Also, the message may be a message received over a wireless communications channel and selecting may include selecting based upon a wireless communications channel threshold value.

The possible bit error patterns are preferably stored in a memory and/or table, and are preferably single-bit error patterns. At block 150, the bit error patterns of the weakest bits (i.e. lowest quality metric) are determined, and the table of possible bit error patterns is referenced (block 160) to find a match. For example, it may be determined that a multiple-bit error has occurred in the N message bits and M CRC bits of the received message based upon the M CRC bits and further based upon a failure to match with the single-bit error patterns. Here, correcting may comprise correcting the multiple-bit error based upon a logical combination, such as an exclusive OR operation, of a plurality of single-bit error patterns.

The present invention provides a method and device for using the common CRC code as an error detection mechanism, its common usage, as well as an error correaction scheme. The invention makes use of a look up table, whose dimension is that of the total transmitted message size. Each element of the table contains the CRC value that would be received if the bit indexed was in error. The invention uses this table directly, along with a threshold and received bit quality metrics, to automatically correct single received bit errors. An additional mechanism is described to use the table, an additional threshold and received bit quality metrics to check for and correct multiple bit errors. It should be noted that as the number of bit errors increase the complexity of the system to correct each error, the benefits of this approach may decrease.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for error detection and correction in a received message comprising N message bits and M Cyclic Redundancy Check (CRC) bits appended thereto, the method comprising:

determining whether at least one bit error has occurred in the N message bits and M CRC bits of the received message based upon the M CRC bits;

assigning a quality metric to each of the N message bits and M CRC bits;

when at least one bit error is determined, then selecting, from the N message bits and M CRC bits, K bits with a lowest quality metric; and correcting the at least one bit error based upon possible bit error patterns and the selected K bits.

2. The method according to claim 1, wherein the assigned quality metric is based upon at least one of a Received Signal to Noise Ratio (RSNR) and a Forward Error Correction (FEC) confidence value.

3. The method according to claim 1, wherein the message comprises a message received over a wireless communications channel and wherein selecting comprises selecting based upon a wireless communications channel threshold value.

4. The method according to claim 1, wherein the possible bit error patterns are stored in a memory.

5. The method according to claim 1, further comprising at least one of comparing the assigned quality metrics to a threshold to select the K bits and sorting the quality metrics to select the K bits.

6. The method according to claim 5, wherein the threshold is based upon the number N of message bits and the number M of CRC bits.

7. The method according to claim 1, wherein the possible bit error patterns comprise single-bit error patterns.

8. The method according to claim 7, wherein determining comprises determining whether a multiple-bit error has occurred in the N message bits and M CRC bits of the received message based upon the M CRC bits and further based upon a failure to match with the single-bit error patterns.

9. The method according to claim 8, wherein correcting comprises correcting the multiple-bit error based upon a logical combination of a plurality of single-bit error patterns.

10. The method according to claim 9, wherein the logical combination is based upon at least an exclusive OR operation.

11. A method for error detection and correction in a received message comprising N message bits and M Cyclic Redundancy Check (CRC) bits appended thereto, the method comprising:

determining whether an error has occurred in the N message bits and M CRC bits of the received message based upon at least the M CRC bits;

determining whether the error is a multiple-bit error based upon a failure to match a CRC value with possible single-bit error patterns stored in a table;

when a multiple-bit error is determined, then selecting, from the N message bits and M CRC bits, K bits with a lowest quality metric; and correcting the error based upon a logical combination of a plurality of the single bit error patterns and the selected K bits.

12. The method according to claim 11, wherein the logical combination is based upon at least an exclusive OR operation.

13. The method according to claim 11, further comprising assigning a quality metric to each of the N message bits and M CRC bits.

14. The method according to claim 13, further comprising at least one of comparing the assigned quality metrics to a threshold to select the K bits and sorting the quality metrics to select the K bits.

15. The method according to claim 14, wherein the threshold is based upon the number N of message bits and the number M of CRC bits.

16. A communications device comprising:
an input for receiving a message comprising N message bits and N Cyclic Redundancy Check (CRC) bits appended thereto;
a error detection and correction block connected to said input for determining whether at least one bit error has occurred in the N message bits and M CRC bits of the received message based upon at least the M CRC bits, and including a quality metric unit to assign a quality metric to each of the N message bits and M CRC bits, and when at least one bit error is determined, then selecting, from the N message bits and M CRC bits, K bits with a lowest quality metric, and correcting the at least one bit error based upon possible bit error patterns and the selected K bits; and
an output connected to said error detection and correction block for outputting the corrected message.

17. The communications device according to claim 16, wherein said error detection and correction block further includes at least one of a comparator to compare the assigned quality metrics to a threshold to select the K bits, and a sorter to sort the quality metrics and select the K bits.

18. The communications device according to claim 16, wherein the assigned quality metric is based upon at least one of a Received Signal to Noise Ratio (RSNR) and a Forward Error Correction (FEC) confidence value.

19. The communications device according to claim 16, wherein said error detection and correction block includes a memory to store the possible bit error patterns.

20. The communications device according to claim 16 wherein the communications device is a wireless communications device; and the input comprises an antenna.

21. The communications device according to claim 16, wherein the possible bit error patterns comprise single-bit error patterns.

22. The communications device according to claim 21, wherein said error detection and correction block determines whether a multiple-bit error has occurred in the N message bits and M CRC bits of the received message based upon the M CRC bits and further based upon a failure to match with the single-bit error patterns.

23. The communications device according to claim 22, wherein said error detection and correction block corrects the multiple-bit error based upon a logical combination of a plurality of single-bit error patterns.

* * * * *